United States Patent
Deweerd

(10) Patent No.: US 8,936,889 B2
(45) Date of Patent: Jan. 20, 2015

(54) METHOD AND APPARATUS FOR EUV MASK HAVING DIFFUSION BARRIER

(71) Applicant: Intermolecular Inc., San Jose, CA (US)

(72) Inventor: Wim Y. Deweerd, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 210 days.

(21) Appl. No.: 13/804,011

(22) Filed: Mar. 14, 2013

(65) Prior Publication Data

US 2013/0196257 A1    Aug. 1, 2013

Related U.S. Application Data

(62) Division of application No. 12/959,265, filed on Dec. 2, 2010, now Pat. No. 8,426,085.

(51) Int. Cl.
*G03F 1/22* (2012.01)
*G03F 1/24* (2012.01)
*G03F 1/52* (2012.01)

(52) U.S. Cl.
CPC .. *G03F 1/52* (2013.01); *G03F 1/22* (2013.01); *G03F 1/24* (2013.01)
USPC ............................................................ 430/5

(58) Field of Classification Search
USPC .......................... 430/5, 322, 323, 324; 378/35
See application file for complete search history.

(56) References Cited

U.S. PATENT DOCUMENTS

2005/0277030 A1 * 12/2005 Yan ................................... 430/5

* cited by examiner

*Primary Examiner* — Stephen Rosasco

(57) ABSTRACT

A photomask is provide. The photomask includes a substrate having a multi-layer stack disposed over the substrate. The multilayer stack has alternating first second and third layers disposed over each other, wherein the first, second and third layers are composed of first, second and third materials, respectively, and wherein at least the second layer is formed through an atomic layer deposition process. A capping layer is disposed over the multilayer stack; and an absorber layer disposed over the capping layer. A method for evaluating materials, unit processes, and process sequences for manufacturing a photomask is also provided.

11 Claims, 4 Drawing Sheets

METHOD AND APPARATUS FOR EUV MASK HAVING DIFFUSION BARRIER

RELATED APPLICATIONS

This is a Divisional application of U.S. patent application Ser. No. 12/959,265, filed on Dec. 2, 2010, which is related to U.S. patent application Ser. No. 12/959,274 filed on Dec. 2, 2010, each of which is herein incorporated by reference for all purposes.

BACKGROUND

Extreme ultraviolet (EUV) lithography, which is based upon exposure with the portion of the electromagnetic spectrum having a wavelength of 10-20 nanometers, may be used to print features with smaller critical dimension (CD) than other more conventional optical techniques, such as those utilizing deep ultraviolet (DUV) radiation or so-called 193 nm lithography.

The mask utilized for the extreme ultraviolet lithography is a sophisticated unit including a Bragg mirror or dielectric mirror deposited on a substrate, which is relatively expensive due to the low tolerances for any defects and high required uniformity of these masks. These masks require frequent cleaning to reduce or eliminate defects during the optical lithography operation. The cleaning is typically performed at an elevated temperature to enable and/or enhance the efficiency of the cleaning chemistry. In addition, during use the masks are inadvertently heated through exposure with extreme ultraviolet light. Thus, the mask is frequently exposed to temperatures above ambient during the mask's lifecycle and is used at temperatures exceeding ambient during normal operation. Consequently, these conditions can cause several types of chemical diffusion and chemical reactions within the multilayer stack of the Bragg mirror. For example, surface organics may diffuse into the stack. In addition, the reflective and spacer layers within the stack can start chemically intermixing and reacting at their interfaces. Over time, the performance degrades for the mask in the mask will eventually fail due to loss of its carefully optimized optical properties.

It is within this context that the current embodiments arise.

SUMMARY

Embodiments of the present invention provide a mask having an extended lifecycle for a EUV photolithography process, lower defect levels during its useful lifecycle and a method for evaluating different combinations of materials, process sequences, and unit processes for manufacturing the mask blanks. Several inventive embodiments of the present invention are described below.

In one aspect of the invention, a photomask is provided. The photomask includes a substrate, and a multi-layer stack functioning as a Bragg mirror deposited over the substrate. The multilayer stack has alternating first second and third layers deposited over each other, wherein the first, second and third layers are composed of first, second and third materials, respectively, and wherein at least the second layer is formed through an atomic layer deposition process. A capping layer deposited over the multilayer stack and an absorber layer deposited over the capping layer In another aspect of the invention, a method for evaluating materials, unit processes, and process sequences for manufacturing a photomask is provided. The method initiates with processing a first substrate having a pattern of multiple layers representing a Bragg mirror portion of the photomask. The first substrate is tested for diffusion properties between the multiple layers. Regions on a second substrate are processed in a combinatorial manner by varying one of materials, unit processes or process sequences based on results from the testing of the first substrate. The regions on the second substrate represent a barrier layer deposited over one of the multiple layers. The processed regions on the second substrate are tested for optical properties Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Like reference numerals designate like structural elements.

DETAILED DESCRIPTION

Figure 1:
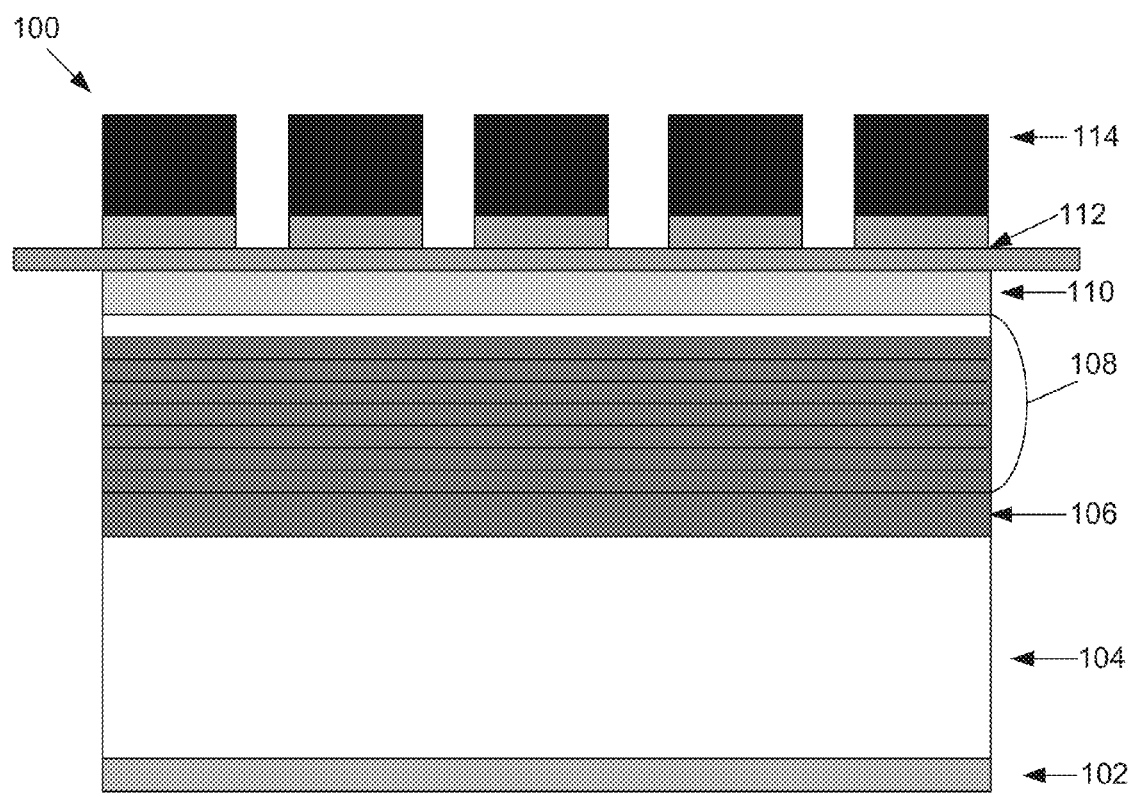
FIG. 1 is a simplified schematic diagram illustrating an exemplary EUV mask structure in accordance with one embodiment of the invention.

The embodiments described herein provide a method and apparatus related to an EUV photomask for lithography processes. It will be obvious, however, to one skilled in the art, that the present invention may be practiced without some or all of these specific details. In other instances, well known process operations have not been described in detail in order not to unnecessarily obscure the present invention.

The embodiments described herein provide for an extreme ultraviolet (EUV) mask that has an extended lifetime and lower defectivity to increase yields during its useful lifecycle due to the construction of the multi-stack layers for the Bragg mirror portion of the mask. In one embodiment, the stacked layers, which consist of a reflective material disposed over a spacer material, have a barrier layer defined at the interface of the reflective material and the spacer material. The barrier layer is transparent to the wavelength of light utilized for the EUV process. Due to the extremely thin nature of the barrier layer, which may be 1 nanometer (nm) or less in thickness, an atomic layer deposition (ALD) process is utilized to deposit the barrier layer in one embodiment. With the barrier layer disposed at each interface of the reflective and spacer material, diffusion of oxygen, fluorine, chlorine, undesired metals or any surface organics into the multilayer stack is prevented. In addition, diffusion of the reflective material into the spacer material and vice versa is also prevented. As explained in more detail below, the barrier layer may consist of two sublayers where the sublayers share a common component. In addition, one sublayer shares a component with the reflective layer and the other sublayer shares a component with the spacer layer.

The embodiments described herein enable the application of combinatorial techniques to process sequence integration in order to arrive at a globally optimal sequence of the manufacturing operations by considering interaction effects between the unit manufacturing operations, the process conditions used to effect such unit manufacturing operations, as well as materials characteristics of components utilized within the unit manufacturing operations. These combinatorial aspects are extended to evaluating the best candidates for barrier layers deposited between the reflective and spacer layers of a Bragg mirror in an EUV mask and optimize film thickness and optical properties. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a semiconductor device. A global optimum sequence order is therefore derived and as part of this derivation, the unit processes, unit process parameters and materials used in the unit process operations of the optimum sequence order are also considered.

The embodiments described further below analyze a portion or sub-set of the overall process sequence used to manufacture a semiconductor device. Once the subset of the process sequence is identified for analysis, combinatorial process sequence integration testing is performed to optimize the materials, unit processes and process sequence used to build that portion of the device or structure. During the processing of some embodiments described herein, structures are formed on the processed semiconductor substrate that are equivalent to the structures formed during actual production of the semiconductor device. For example, such structures may include, but would not be limited to, trenches, vias, interconnect lines, capping layers, masking layers, diodes, memory elements, gate stacks, transistors, or any other series of layers or unit processes that create an intermediate structure found on semiconductor chips. While the combinatorial processing varies certain materials, unit processes, or process sequences, the composition or thickness of the layers or structures or the action of the unit process, such as cleaning, surface preparation, etch, deposition, planarization, implantation, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, or process sequences) and not the lack of process uniformity.

FIG. 1 is a simplified schematic diagram illustrating an exemplary EUV mask structure in accordance with one embodiment of the invention. Mask 100 is composed of a number of different layers and materials stacked upon each other. At a bottom layer, a hard conductive coating 102 is supplied. In one embodiment the conductive coating is a chromium nitride layer that enables chucking for processing in a semiconductor tool. Disposed over layer 102 is low thermal expansion material (LTEM) 104. LTEM 104 may be a glass or silica composition and functions as a holder for the upper layers. Underlayer 106 is deposited above layer 104 and functions as a transitional layer between layer 104 and the multilayer stack 108. Multilayer stack 108 provides alternating pairs of reflective material and spacer material layers. In one embodiment the reflective material is molybdenum and the spacer material is silicon. Any suitable number of alternating pairs may be utilized for the multilayer stack, e.g., 40 or more pairs can be used in one embodiment. However, this exemplary number of pairs is not meant to be limiting as more or less pairs that achieve the desired reflectance can be utilized. It should be appreciated that other material may be incorporated into the material stack as long as the functionality provided by the multilayer stack, i.e., the Bragg mirror functionality, is maintained. Disposed between each reflective layer and spacer layer is a thin diffusion barrier layer, the details of which are described in more detail below. Thus, the multilayer stack 108 consists of a repeating pattern of these three layers in the embodiments described herein. Capping layer 110 is disposed over a top surface of the multilayer stack 108. Capping layer 110 is transparent to the extreme ultraviolet light, i.e., a wavelength between about 10 and 20 nanometers, and may be composed of ruthenium or tantalum or an alloy of ruthenium or tantalum, in one embodiment. Disposed over capping layer 110 is buffer layer 112 and absorber layer 114. As illustrated in FIG. 1 absorber layer 114 and buffer layer 112 are patterned in order to achieve the desired reflectance for mask 100. One skilled in the art will appreciate that buffer layer 112 is applied as a transitional layer in order to link the absorber layer 114 and capping layer 110. In addition, absorber layer 114 will absorb the ultraviolet light, while the gaps defined by the patterning of absorber layer 114 allows the ultraviolet light to pass through into the multilayer stack to be reflected therefrom. It should be appreciated that the illustration provided for FIG. 1 is an exemplary structure for an EUV mask. That is, other EUV masks may include additional layers or eliminate certain layers depicted in the exemplary illustration of FIG. 1.

Figure 2:
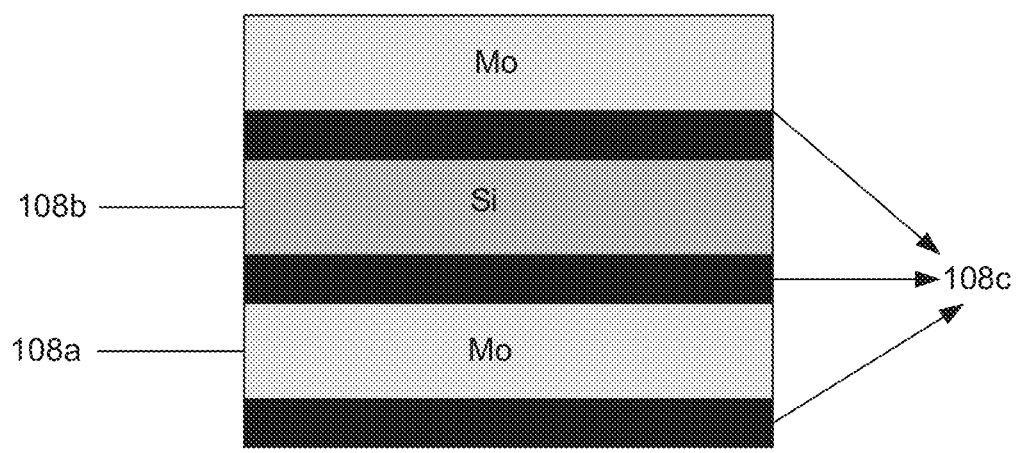
FIG. 2 is a simplified schematic diagram illustrating a cross sectional view providing details of the multilayer stack in accordance with one embodiment of the invention.

FIG. 2 is a simplified schematic diagram illustrating a cross sectional view providing details of the multilayer stack in accordance with one embodiment of the invention. As illustrated the multilayer stack consists of alternating pairs of molybdenum layers 108a and silicon layers 108b, having diffusion barriers 108c disposed there between. One skilled in the art will appreciate that molybdenum layers 108a function as reflective layers and silicon layers 108b function as spacers which are transparent to the wavelength of the light being reflected by the reflective layers. The thickness of the spacer and reflective layers 108b and 108c, is on the order of about 5 nm in one embodiment. The thickness of the diffusion barrier 108c is on the order of about 2 nm or less in one embodiment. Thus, the reflective and spacer layers may be deposited through a physical vapor deposition, chemical vapor deposition, sputtering or some other conventional deposition process, whereas with respect to diffusion barrier 108c, an atomic layer deposition is utilized due to the thin layer required in this embodiment. Thus, in this embodiment, a tiered deposition is provided with the barrier layer utilizing an ALD process and the remaining layers of the multilayer stack utilizing a different deposition process. Barrier layer 108c is relatively thin (2 nm or less) and optically transparent. In addition barrier layer 108c is a closed film that acts as a barrier for chemical elements passing therethrough at the temperature range of interest. The temperature range of interest includes the operating temperature for the lithography process, typically 50° C. and the wet cleaning temperature for the mask which may be as high as 80° C. and above. Several materials can be utilized for the barrier layer which are compatible with ALD deposition, including carbides, nitrides, and borides, e.g. silicon carbide (SiC), silicon nitride (SiN), silicon boride (SiB), molybdenum nitride (MoN), titanium nitride (TiN), etc.

Figure 3:
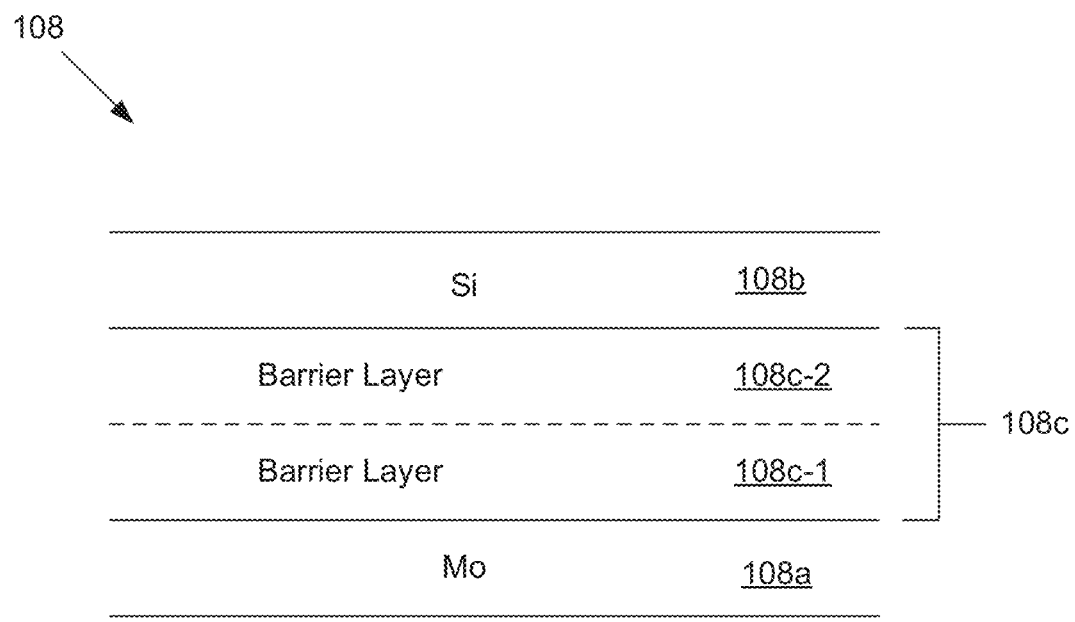
FIG. 3 is a simplified schematic diagram illustrating a cross-sectional view of a single repeated pattern of the multilayer stack in accordance with one embodiment of the invention.

FIG. 3 is a simplified schematic diagram illustrating a cross-sectional view of a single repeated pattern of the multilayer stack in accordance with one embodiment of the invention. Spacer layer 108b is disposed over Barrier layer 108a, which is disposed over reflective layer 108c. As mentioned above, in one embodiment of spacer layer 108b is composed of silicon and reflective layer 108a is composed of molybdenum. In this embodiment barrier layer 108c is composed of two sublayers 108c-2 and 108c-1. It should be appreciated that through the use of atomic layer deposition, a thin layer of molybdenum nitride may be deposited as sublayer 108c-1 and another thin layer of silicon nitride may be deposited as layer 108c-2. In this embodiment sublayer 108c-1 shares a component of reflective layer 108a, i.e., the reflective material which may be Mo, and sublayer 108c-1 shares a component of sublayer 108c-2, i.e., nitrogen, carbon, or boron, when the barrier layer is one of a nitride, carbide, or boride, respectively.

Figure 4:
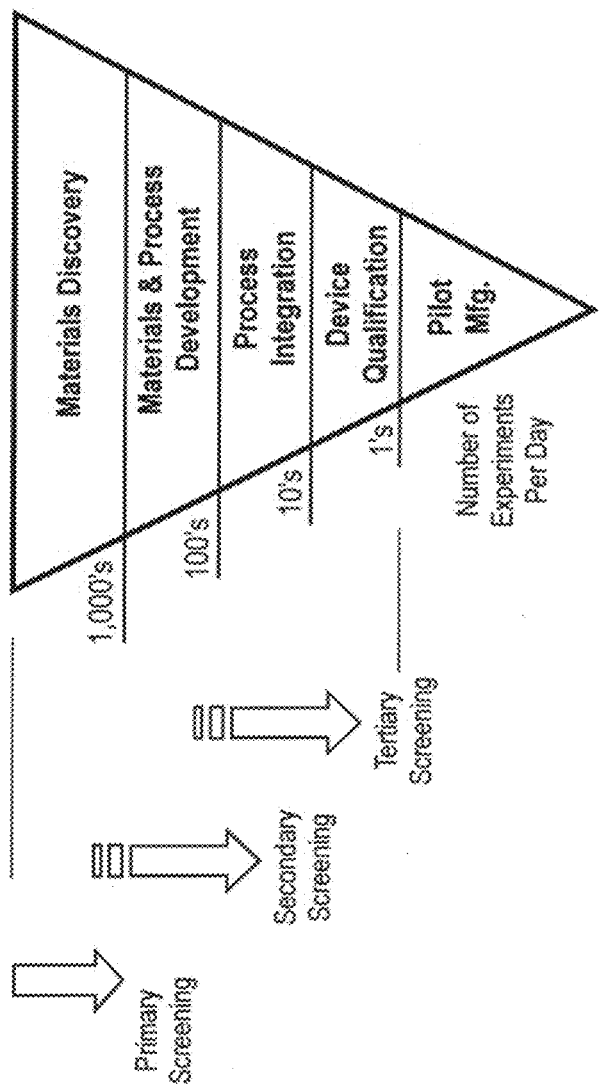
FIG. 4 is a simplified schematic diagram illustrating an overview of the High-Productivity Combinatorial (HPC) screening process for use in evaluating materials, unit processes, and process sequences for the manufacturing of semiconductor devices in accordance with one embodiment of the invention.

FIG. 4 is a simplified schematic diagram illustrating an overview of the High-Productivity Combinatorial (HPC) screening process for use in evaluating materials, unit processes, and process sequences for the manufacturing of semiconductor devices in accordance with one embodiment of the invention. As illustrated in FIG. 4, primary screening incorporates and focuses on materials discovery. Here, the materials may be screened for certain properties in order to select possible candidates for a next level of screening. In the initial primary screening there may be thousands of candidates which are subsequently reduced to hundreds of candidates. These hundreds of candidates can then be used or advanced to secondary screening processes which will look at materials and unit processes development. In the secondary screening level, process integration may be additionally considered to narrow the candidates from hundreds of candidates to tens of candidates. Thereafter, tertiary screening further narrows these candidates through process integration and device qualification in order to identify some best possible optimizations in terms of materials, unit processes and process sequence integration.

In one embodiment, the primary and secondary testing may occur on a coupon, while the tertiary testing is performed on a production size wafer. Through this multi-level screening process, the best possible candidates have been identified from many thousands of options. The time required to perform this type of screening will vary, however, the efficiencies gained through the HPC methods provide a much faster development system than any conventional technique or scheme. While these stages are defined as primary second and tertiary, these are arbitrary labels placed on these steps. Furthermore, primary screening is not necessarily limited to materials research and can be focused on unit processes or process sequences, but generally involves a simpler substrate, less steps and quicker testing than the later screening levels. With regard to the photomask described herein, the primary testing may involve experimentation on a coupon or substrate with multiple layers being disposed over the coupon or substrate and with the barrier diffusion layers in between the reflective or spacer layers. The resulting substrate and stack may then be repeatedly heated up and checked for diffusion/thermal stability properties. Thereafter, secondary screening may take the most promising candidates from the primary screening and perform further experiments. In one embodiment the experiments for the secondary screening may include blanket depositing of the barrier material selected from the primary screening onto a coupon or substrate and evaluating that material for optical properties, e.g., reflectance. From the selected candidates of the secondary screening a tertiary screening can be performed where the EUV mask is manufactured and utilized to define a resist pattern, which is then developed and evaluated. The mask can be used multiple times and cleaned multiple times to provide data on the robustness and longevity of the mask.

The stages also may overlap and there may be feedback from the secondary to the primary, and the tertiary to the secondary and/or the primary to further optimize the selection of materials, unit processes and process sequences. In this manner, the secondary screening begins while primary screening is still being completed, and/or while additional primary screening candidates are generated, and tertiary screening can begin once a reasonable set of options are identified from the secondary screening. Thus, the screening operations can be pipelined in one embodiment. As a general matter and as discussed elsewhere in more detail, the level of sophistication of the structures, process sequences, and testing increases with each level of screening. Furthermore, once the set of materials, unit processes and process sequences are identified through tertiary screening, they must be integrated into the overall manufacturing process and qualified for production, which can be viewed as quaternary screening or production qualification. In one more level of abstraction, a wafer can be pulled from the production process, combinatorially processed, and returned to the production process under tertiary and/or quaternary screening.

In the various screening levels, the process tools may be the same or may be different. For example, in dry processing the primary screening tool may be a combinatorial sputtering tool available described, for example, in U.S. Pat. No. 5,985,356. This tool is efficient at preparing multi-material samples in regions for simple materials properties analysis. For secondary and/or tertiary screening technique, a modified cluster tool may be retrofitted with a combinatorial chamber. As another example, in wet processing, the primary and secondary screening can be implemented in a combinatorial tool. The main differences here are not the capabilities of the tools, but the substrates used, the process variations or structures created and the testing done. For the tertiary tool, a wet reactor with combinatorial and non-combinatorial chambers described in U.S. application Ser. No. 11/647,881 filed Dec. 29, 2006, could be used for integrated and more sophisticated processing and analysis.

In the development or screening cycle, typically there are many materials synthesized or processed involving large permutations of a plurality of materials, a plurality of processes, a plurality of processing conditions, a plurality of material application sequences, a plurality of process integration sequences, and combinations thereof. Testing of these many materials may use a simple test, such as adhesion or resistivity and may involve a blanket wafer (or coupon) or one with basic test structures to enable testing for one or more desired properties of each material or unit process. Once the successful materials or unit processes have been selected, combinatorial techniques are applied to analyze these materials or processes within a larger picture. That is, the combinatorial techniques determine whether the selected materials or unit processes meet more stringent requirements during second stage testing. The processing and testing during the second stage may be more complex, e.g., using a patterned wafer or coupon, with more test structures, larger regions, more variations, more sophisticated testing, etc. For example, the structure defined by the material and unit process sequence can be tested for properties related or derived from the structure to be integrated into the commercial product.

This iterative process may continue with larger and more complex test circuits being used for testing different parameters. This approach serves to increase the productivity of the combinatorial screening process by maximizing the effective use of the substrate real estate, and optimizing the corresponding reactor and test circuit design with the level of sophistication required to answer the level of questions necessary per stage of screening. Complex reactors and/or test circuit designs are utilized at later stages of screening when desired properties of the materials, processing conditions, process sequence, etc. are substantially known and/or have been refined via prior stages of screening.

The subsections of test structures generated from previous testing for some screening levels may be incorporated into subsequent, more complex screening levels in order to further evaluate the effectiveness of process sequence integrations and to provide a check and correlation vehicle to the previous screen. It should be appreciated that this ability allows a developer to see how results of the subsequent process differed from the results of the previous process, i.e., take into account process interactions. In one example, materials compatibility may be used as a primary test vehicle in primary screening, then specific structures incorporating those materials (carried forward from the primary screen) are used for the secondary screening. As mentioned herein, the results of the secondary screening may be fed back into the primary screening also. Then, the number and variety of test structures is increased in tertiary screening along with the types of testing, for example, electrical testing may be added or device characterization may be tested to determine whether certain critical parameters are met. Of course, electrical testing is not reserved for tertiary testing as electrical testing may be performed at other screening stages. The critical parameters generally focus on the requirements necessary to integrate the structures created from the materials and process sequence into the commercial product, e.g., a die.

In summary, the embodiments described above provide for a robust EUV mask that has a prolonged lifecycle. The barrier layers, deposited through an ALD process, protect the multi-layer stack from diffusion of material and chemical reactions that may be encouraged when the mask is at an elevated temperature from ambient conditions, hence lowering defects which in turn will increase yields and extend the useful lifecycle of the mask. While exemplary barrier layers have been listed above, the embodiments are not limited to those compounds as any suitable compound that can be deposited as a thin layer through an ALD process, e.g., 2 nm or less; is transparent to the desired wavelength of light, e.g. 10-20 nm; acts as a barrier to chemical elements passing therethrough at the temperature range of interest; and results in a closed film; may be utilized for the barrier layer.

The above examples are provided for illustrative purposes and not meant to be limiting. The embodiments described herein may be applied to any process sequence to optimize the process sequence, as well as the materials, processes, and processing conditions utilized in the manufacture of a semiconductor device where there exist multiple options for the materials, processes, processing conditions, and process sequences.

The present invention provides greatly improved methods and apparatus for the differential processing of regions on a single substrate. It is to be understood that the above description is intended to be illustrative and not restrictive. Many embodiments and variations of the invention will become apparent to those of skill in the art upon review of this disclosure. Merely by way of example a wide variety of process times, process temperatures and other process conditions may be utilized, as well as a different ordering of certain processing steps. The scope of the invention should, therefore, be determined not with reference to the above description, but instead should be determined with reference to the appended claims along with the full scope of equivalents to which such claims are entitled.

The explanations and illustrations presented herein are intended to acquaint others skilled in the art with the invention, its principles, and its practical application. Those skilled in the art may adapt and apply the invention in its numerous forms, as may be best suited to the requirements of a particular use. Accordingly, the specific embodiments of the present invention as set forth are not intended as being exhaustive or limiting of the invention.

The embodiments described above provide methods and apparatus for the parallel or rapid serial synthesis, processing and analysis of novel materials having useful properties identified for semiconductor manufacturing processes. Any materials found to possess useful properties can then subsequently be prepared on a larger scale and evaluated in actual processing conditions. These materials can be evaluated along with reaction or processing parameters through the methods described above. In turn, the feedback from the varying of the parameters provides for process optimization. Some reaction parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, etc. In addition, the methods described above enable the processing and testing of more than one material, more than one processing condition, more than one sequence of processing conditions, more than one process sequence integration flow, and combinations thereof, on a single substrate without the need of consuming multiple substrates per material, processing condition, sequence of operations and processes or any of the combinations thereof. This greatly improves the speed as well as reduces the costs associated with the discovery and optimization of semiconductor manufacturing operations.

Moreover, the embodiments described herein are directed towards delivering precise amounts of material under precise processing conditions at specific locations of a substrate in order to simulate conventional manufacturing processing operations. As mentioned above, within a region the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes and process sequences may vary. It should be noted that the discrete steps of uniform processing is enabled through the HPC systems described herein.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for performing a combinatorial process on a substrate, the method comprising:
    defining multiple regions on the substrate;
    forming a pattern of multiple layers within each region of the substrate by varying one of materials, unit processes, or process sequences of the forming in a combinatorial manner between the multiple regions,
        wherein the multiple layers comprise barrier diffusion layers, reflective layers, and spacer layers,
        wherein the barrier diffusion layers are between the reflective layers and the spacer layers, and
        wherein the pattern of multiple layers within each region of the substrate for a Bragg mirror portion of an EUV photomask; and
    testing each of the substrate regions for diffusion properties between the multiple layers.

2. The method of claim 1, further comprising:
    defining multiple regions on a second substrate;
    forming a pattern of multiple layers within each region of the second substrate by varying one of materials, unit processes, or process sequences of the forming in a combinatorial manner between the multiple regions,
        wherein the multiple layers comprise barrier diffusion layers, reflective layers, and spacer layers,
        wherein the barrier diffusion layers are between the reflective layers and the spacer layers, and
        wherein the pattern of multiple layers within each region of the substrate for a Bragg mirror portion of an EUV photomask; and
    testing each of the second substrate regions for optical properties.

3. The method of claim 2, where the optical properties include reflectance.

4. The method of claim 1, wherein the testing of the first substrate includes repeatedly heating the first substrate.

5. The method of claim 1, wherein the spacer layers comprise silicon, the reflective layers comprise molybdenum, and the barrier layers comprise one of a nitride, a carbide or a boride.

6. The method of claim 5, wherein the barrier layers comprise one of silicon carbide, silicon nitride, silicon boride, molybdenum nitride, or titanium nitride.

7. The method of claim 1, wherein the spacer layers each have a thickness of about 5 nm.

8. The method of claim 1, wherein the reflective layers each have a thickness of about 5 nm.

9. The method of claim 1, wherein the barrier layers each have a thickness of about 2 nm or less.

10. The method of claim 1, wherein the spacer layers and the reflective layers are deposited using one of physical vapor deposition or chemical vapor deposition.

11. The method of claim 1, wherein the barrier layers are deposited using atomic layer deposition.

* * * * *